United States Patent [19]
Jang et al.

[11] Patent Number: 5,517,142
[45] Date of Patent: May 14, 1996

[54] OUTPUT BUFFER WITH A REDUCED TRANSIENT BOUNCING PHENOMENON

[75] Inventors: Seong J. Jang; Young H. Jun, both of Seoul, Rep. of Korea

[73] Assignee: Goldstar Electron Co., Ltd., Choongchunbook-Do, Rep. of Korea

[21] Appl. No.: 294,715

[22] Filed: Aug. 23, 1994

[30] Foreign Application Priority Data

Sep. 3, 1993 [KR] Rep. of Korea .................. 17662/1993

[51] Int. Cl.⁶ .................................................. H03B 1/00
[52] U.S. Cl. ........................... 327/108; 326/87; 326/374
[58] Field of Search ........................... 326/30–34, 56, 326/57, 58, 85, 89; 327/108, 109, 110, 170, 374, 376, 379, 383, 384; 365/203

[56] References Cited

U.S. PATENT DOCUMENTS 5,023,472  6/1991  Hashimoto .......................... 327/108
5,198,699  3/1993  Hashimoto .......................... 327/170
5,341,338  8/1994  Hashiguchi et al. ................... 326/57

*Primary Examiner*—Timothy P. Callahan
*Assistant Examiner*—Jeffrey Zweizig
*Attorney, Agent, or Firm*—Lowe, Price, Leblanc & Becker

[57] ABSTRACT

An output buffer is disclosed. In the prior art, when an output buffer swings to a supply voltage Vcc and a ground voltage Vss, the current drops rapidly at the supply voltage or the ground voltage, thereby generating bouncing of the supply voltage Vcc or bouncing of the ground voltage Vss. For eliminating this phenomenon, a capacitor is provided connected to an output node of the inventive output buffer to reduce the amount of the current flowing to the supply voltage terminal and the ground voltage terminal at the time point at which an output level is changed. Therefore, voltage drop and the bouncing of the supply voltage and the ground voltage is reduced by applying a precharge voltage which is precharged in the capacitor to the output node.

15 Claims, 4 Drawing Sheets

OUTPUT BUFFER WITH A REDUCED TRANSIENT BOUNCING PHENOMENON

BACKGROUND OF THE INVENTION

1. Field of the Invention

The present invention relates to an output buffer, and more particularly to an output buffer for improving the operational speed of the integrated circuits and for preventing malfunctions by reducing a transient bouncing phenomena occurring when switching between a supply voltage Vcc and a ground voltage Vss.

2. Description of the Conventional Art

In an integrated circuit like a semiconductor memory device, it is well known that a signal noise produced by an output buffer becomes a serious problem. This problem is caused by transistors of large size which are included in the output buffer. Also, the problem occurs when the output buffer swings to the high voltage level of Vcc and to the low voltage level of Vss to generate a predetermined data output. When the output buffer swings to the high voltage level of Vcc and to the low voltage level of Vss, the current drops rapidly at the supply voltage Vcc or the ground voltage Vss, thereby generating the bouncing of the high voltage level of Vcc or the bouncing of the low voltage level of Vss. Further, the semiconductor memory device employs a byte-wide memory scheme for accessing more data during one operation cycle, and therefore, a plurality of output buffers are simultaneously enabled to realize the byte-wide memory scheme. Accordingly, since a plurality of output buffers is simultaneously operated, the problem caused by the bouncing of the high voltage level of Vcc and the bouncing of the low voltage level of Vss becomes more severe.

With reference now to FIG. 1, there can be seen an exemplary conventional output buffer. The output buffer of FIG. 1 is a circuit which performs a logical inversion upon an input signal Vi, and includes a PMOS transistors P1 and an NMOS transistor N1 with the respective channels thereof being connected in series between the supply voltage Vcc and the ground voltage Vss. The output Vo is generated from a common connection node between the channels and with the respective gates thereof being commonly connected to receive the input signal Vi.

With reference now to FIG. 2, there can be seen another exemplary conventional output buffer. The output buffer of FIG. 2 includes two NMOS transistors N2 and N3 with the channels thereof being connected in series between the supply voltage Vcc and the ground voltage Vss and with gates thereof being respectively connected to receive input signals VA and VB. An output Vo of the output buffer is generated from a common connection node between the channels of the NMOS transistors N2 and N3.

With the byte-wide memory scheme being employed in the semiconductor memory device, a plurality of the output buffers shown in FIGS. 1 and 2 is contained on the same chip which is shown in FIG. 3. The operations of conventional output buffers of FIGS. 1 and 2 will now be described with reference to FIG. 3. Referring to FIG. 1, when the input signal Vi has a high voltage level of Vcc, the PMOS transistor P1 is turned off and the NMOS transistor N1 is turned on. Therefore, the output Vo assumes a low voltage level of Vss. When the input signal Vi has the low voltage level of Vss, the PMOS transistor P1 is turned on and the NMOS transistor N1 is turned off. Therefore, the output Vo assumes the high voltage level of Vcc. Referring to FIG. 2, when the input signal VA has the high voltage level of Vcc, the input signal VB has the low voltage level of Vss. Therefore, the NMOS transistor N2 is turned on and the NMOS transistor N3 is mined off, thereby generating the output Vo of the high voltage level of Vcc. When the input signal VA has the low voltage level of Vss, the input signal VB has the high voltage level of Vcc. Therefore, the NMOS transistor N2 is turned off and the NMOS transistor N3 is turned on, thereby generating the output Vo of the low voltage level of Vss.

However, the above-described conventional input buffers suffer from the following drawback/shortcoming. As shown in FIG. 3, if a plurality of output buffers connected to the supply voltage Vcc and the ground voltage Vss are simultaneously enabled, a transient bouncing of the supply voltage Vcc and the ground voltage Vss is generated, thereby resulting in reduction of the operation speed. Moreover, if the voltage level drops due to the resistors R of the supply voltage lines, the level of the supply voltage Vcc is lowered and the level of the ground voltage level Vss is raised, thereby resulting in deterioration of the output characteristics of the output buffer.

SUMMARY OF THE INVENTION

It is an object of the present invention to provide an output buffer which improves the operational speed by reducing the current flowing to a supply voltage terminal and a ground voltage terminal when an output level is changed.

In accordance with a first preferred embodiment of the present invention, an output buffer includes an output node for generating an output signal in response to an input of data read from a memory cell to the output buffer, a first capacitor with one electrode thereof being connected to a ground voltage, a boost voltage transfer transistor with a channel thereof being connected between a boost voltage and another electrode of the first capacitor and with a gate thereof being connected to receive a first control signal for precharging the first capacitor to the boost voltage in response to an active input of the first control signal thereto, a first pull-up transistor with a channel thereof being connected between the other electrode of first capacitor and the output node and with a gate thereof being connected to receive a first input signal for transferring the boost voltage precharged in the first capacitor to the output node in response to an active input of the first input signal thereto, a second pull-up transistor with a channel thereof being connected between a supply voltage and the output node and with a gate thereof being connected to receive a second input signal, a second capacitor with one electrode thereof being connected to the supply voltage, a substrate voltage transfer transistor with a channel thereof being connected between a substrate voltage and another terminal of the electrode of the second capacitor and with a gate thereof being connected to receive a second control signal for precharging the second capacitor to the substrate voltage in response to an active input of the second control signal thereto, a first pull-down transistor with a channel thereof being connected between the ground potential and the output node and with a gate thereof being connected to receive a third input signal, and a second pull-down transistor with a channel thereof being connected between the other electrode of the second capacitor and the output node and with a gate thereof being connected to receive a fourth input signal for transferring the substrate voltage precharged in the second capacitor to the output node in response to an active input of the fourth input signal thereto.

In accordance with a second preferred embodiment of the present invention, an output buffer includes an output node for generating an output signal in response to an input of data read from a memory cell to the output buffer, a pull-up transistor with a channel thereof being connected between a supply voltage and the output node and with a gate thereof being connected to receive a first input signal, a capacitor with one electrode thereof being connected to the supply voltage, a substrate voltage transfer transistor with a channel thereof being connected between a substrate voltage and another electrode of the capacitor and with a gate thereof being connected to receive a control signal for precharging the capacitor to the substrate voltage in response to an active input of the control signal thereto, a first pull-down transistor with a channel thereof being connected between a ground voltage and the output node and with a gate thereof being connected to receive a second input signal, and a second pull-down transistor with a channel thereof being connected between the other electrode of the capacitor and the output node and with a gate thereof being connected to receive a third input signal for transferring the substrate voltage precharged in the capacitor to the output node in response to an active input of the third input signal thereto.

In accordance with a third preferred embodiment of the present invention, an output buffer includes an output node for generating an output signal in response to an input of data read from a memory, cell to the output buffer, a capacitor with one electrode thereof being connected to a ground voltage, a boost voltage transfer transistor with a channel thereof being connected between a boost voltage and another electrode of the capacitor and with a gate thereof being connected to receive a control signal for precharging the capacitor to the boost voltage in response to an active input of the control signal thereto, a first pull-up transistor with a channel thereof being connected between the other electrode of the capacitor and the output node and with a gate thereof being connected to receive a first input signal for transferring the boost voltage precharged in the capacitor to the output node in response to an active input of the first input signal thereto, a second pull-up transistor with a channel thereof being connected between the supply voltage and the output node and with a gate thereof being connected to receive a second input signal, and a pull-down transistor with a channel thereof being connected between the ground voltage and the output node and with a gate thereof being connected to receive a third input signal.

These and various other features and advantages of the present invention will be readily understood with reference to the following detailed description taken in conjunction with the accompanying drawings, wherein like reference numerals designate like structural elements.

DETAILED DESCRIPTION OF THE INVENTION

Figure 1:
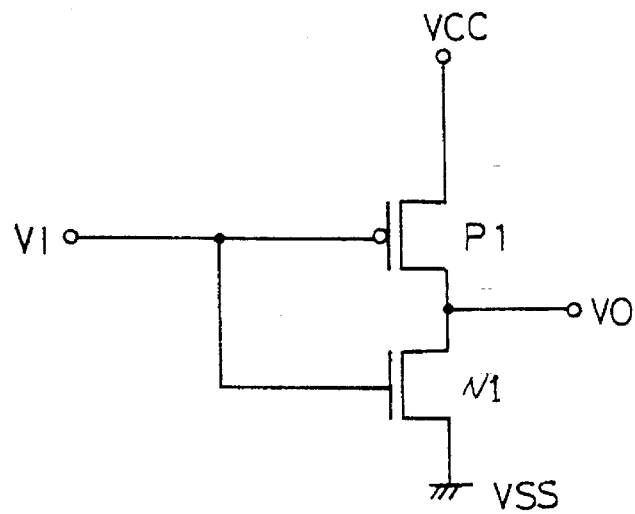
FIGS. 1 and 2 are circuit diagrams showing exemplary conventional output buffers.
Figure 2:
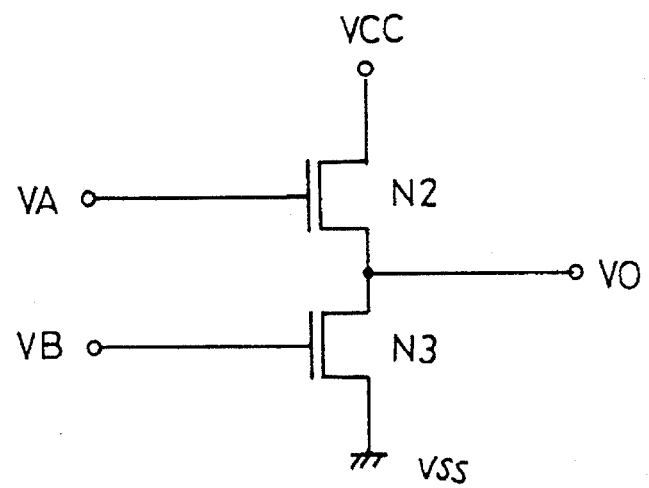
Figure 3:
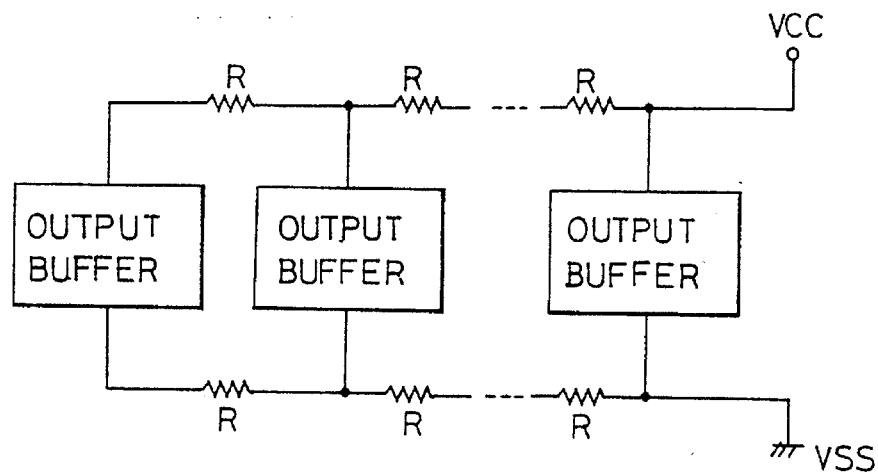
FIG. 3 is a circuit diagram showing a conventional implementation employing a plurality of output buffers.
Figure 4:
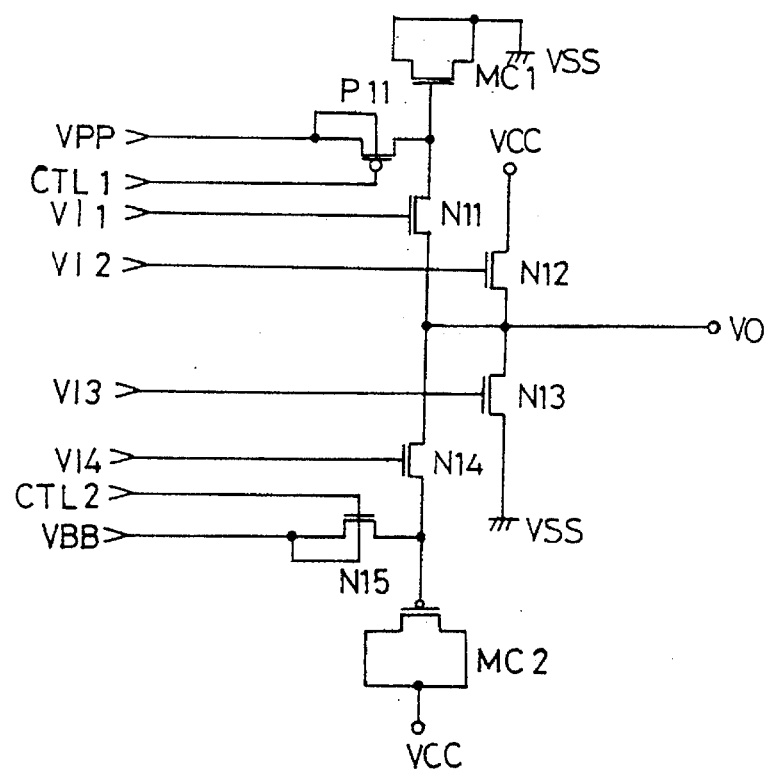
FIG. 4 is a circuit diagram showing an output buffer constructed in accordance with a first preferred embodiment of the present invention.

With reference now to FIG. 4, there can be seen an output buffer constructed embodying the basic inventive concept of the present invention. The output buffer of FIG. 4 includes an output node for generating an output signal Vo in response to an input of data read from a memory cell to the output buffer, a first capacitor MC1 with one electrode thereof being connected to a ground voltage Vss, a first pull-up transistor N11 with a channel thereof being connected between another electrode of first capacitor MC1 and the output node and with a gate being connected to a first input signal Vi1, a boost voltage transfer transistor P11 with a channel thereof being connected between a boost voltage Vpp and the other electrode of the first capacitor MC1 and with a gate thereof being connected to receive a first control signal CTL1, a second pull-up transistor N12 with a channel thereof being connected between a supply voltage Vcc and the output node and with a gate thereof being connected to receive a second input signal Vi2, a second capacitor MC2 with one electrode thereof being connected to the supply voltage Vcc, a first pull-down transistor N13 with a channel thereof being connected between the supply voltage Vcc and the output node and with a gate thereof being connected to receive a third input signal Vi3, a second pull-down transistor N14 with a channel thereof being connected between another electrode of the capacitor MC2 and the output node and with a gate thereof being connected to receive a fourth input signal Vi4, and a substrate voltage transfer transistor N15 with a channel thereof being connected between a substrate voltage VBB and the other electrode of the second capacitor MC2 and with a gate thereof being connected to receive a second control signal CTL2. In the output circuit of FIG. 4, the boost voltage Vpp and the substrate voltage VBB are respectively generated from a voltage boost circuit and a substrate voltage generating circuit provided on the same chip. The substrate voltage VBB is generally referred to as a back-bias voltage in the art. Referring to the output circuit of FIG. 4, each pull-up transistor is a means for providing the supply voltage VBB to the output node and is implemented with an NMOS transistor. Further, each pull-down transistor is a means for discharging the voltage of the output node to the ground voltage Vss and is also implemented with an NMOS transistor. And further, the first and second capacitors MC1 and MC2 are respectively implemented with a MOS transistor having its drain and source electrodes commonly connected whereby the channel forms one electrode and the gate the other electrode of the capacitor. Moreover, the boost voltage transfer transistor P11 is implemented with a PMOS transistor by considering the characteristics of the boost voltage Vpp, and the substrate voltage transistor N15 is implemented with an NMOS transistor by considering the characteristics of the substrate voltage VBB. In the output circuit of FIG. 4, the boost voltage Vpp and the substrate voltage VBB are respectively provided to the pull-up and pull-down stages for reducing transient voltage bouncing phenomena. It should be noted that other voltages may be utilized by considering the characteristics of the boost voltage Vpp and the substrate voltage VBB.

Figure 6:
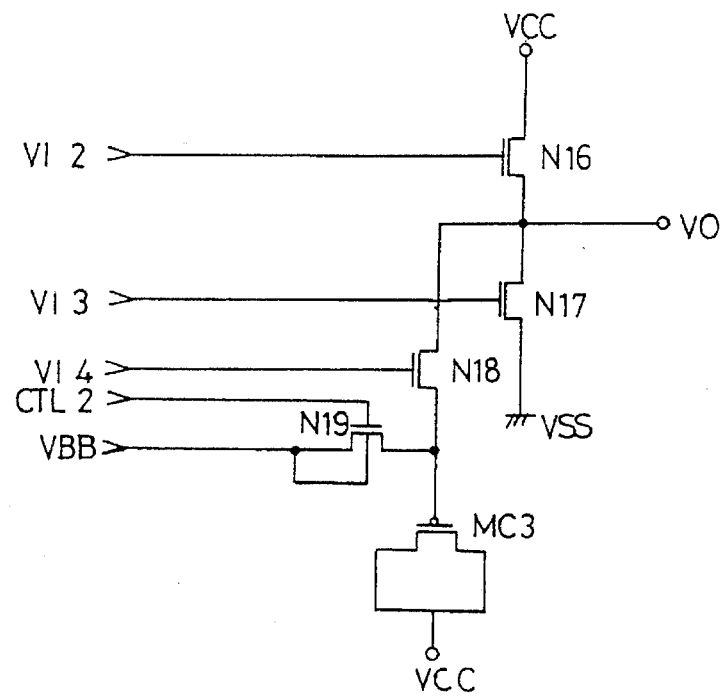
FIG. 6 is a circuit diagram showing an output buffer constructed in accordance with a second preferred embodiment of the present invention.

With reference now to FIG. 6, there can be seen an output buffer constructed in accordance with a second preferred embodiment of the present invention. Particularly, the output circuit of FIG. 6 reduces the bouncing of the ground voltage Vss. The output buffer of FIG. 6 includes an output node for generating an output signal Vo in response to an input of data read from a memory cell to the output buffer, a pull-up transistor N16 with a channel thereof being connected between a supply voltage and the output node and with a gate thereof being connected to receive an input signal Vi2, a first pull-down transistor N17 with a channel thereof being connected between the ground voltage Vss and the output node and with a gate thereof being connected to receive an input signal Vi3, a capacitor MC3 with one electrode thereof being connected to the supply voltage Vcc, a second pull-up transistor N18 with a channel thereof being connected between another electrode of the capacitor MC3 and the output node and with a gate thereof being connected to receive an input signal Vi4, and a substrate voltage transfer transistor N19 with a channel thereof being connected between a substrate voltage VBB and the electrode of the capacitor MC3 and with a gate thereof being connected to receive a control signal CTL2.

Figure 7:
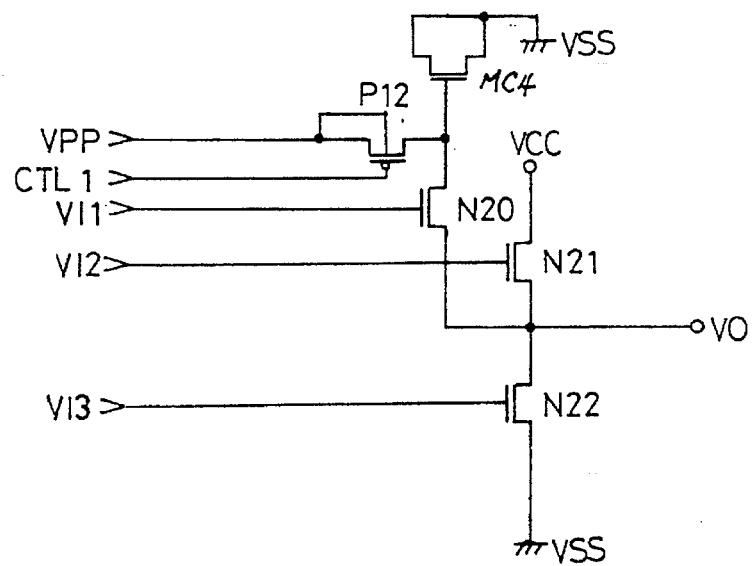
FIG. 7 is a circuit diagram showing an output buffer constructed in accordance with a third preferred embodiment of the present invention

With reference now to FIG. 7, there can be seen an output buffer constructed in accordance with a third preferred embodiment of the present invention. Particularly, the output circuit of FIG. 7 reduces the bouncing of the supply voltage Vcc. The output buffer of FIG. 7 includes an output node for generating an output signal Vo in response to an input of data read from a memory cell to the output buffer, a pull-up transistor N16 with a channel thereof being connected between a supply voltage and the output node and with a gate thereof being connected to receive an input signal Vi2, a capacitor MC4 with one electrode thereof being connected to a ground voltage Vss, a first pull-up transistor N17 with a channel thereof being connected between another electrode of the capacitor MC4 and the output node and with a gate thereof being connected to receive an input signal Vi1, a boost voltage transfer transistor P12 with a channel thereof being connected between a boost voltage VBB and the other electrode of the capacitor MC4 and with a gate thereof being connected to a control signal CTL1, a second pull-up transistor N21 with a channel thereof being connected between a supply voltage Vcc and the output node and with a gate thereof being connected to receive an input signal Vi2, a pull-down transistor N22 with a channel thereof being connected between the ground voltage Vss and the output node and with a gate thereof being connected to receive an input signal Vi3.

Figure 5:
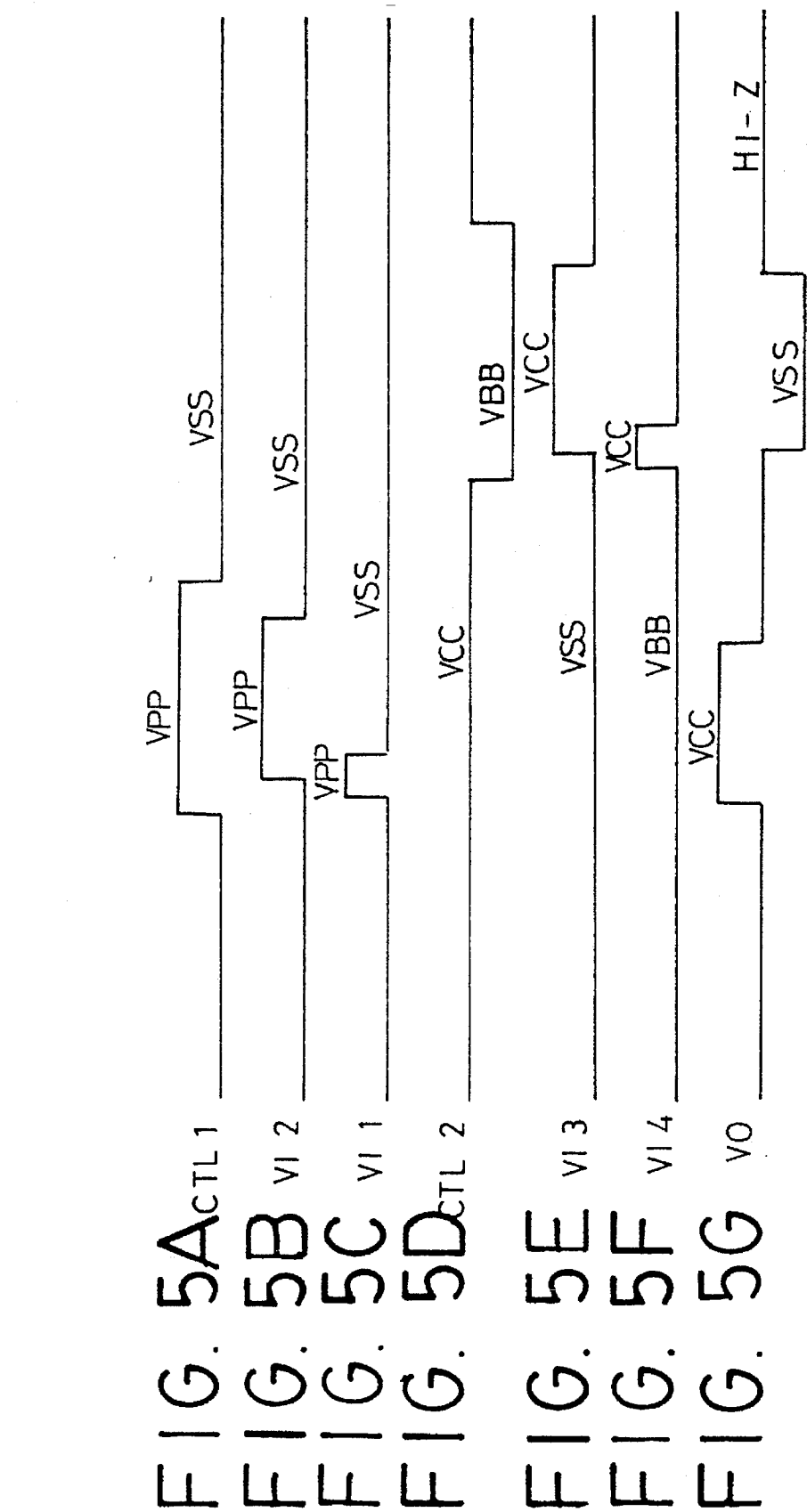
FIGS. 5A through 5G are timing charts for the reference signals according to the output buffer of FIG. 4.

With additional reference now to the timing chart shown in FIG. 5, the operation characteristics of the output buffers respectively shown in FIGS. 4, 6 and 7 will now be described. In the beginning, referring to FIG. 4, the operation in which the control signal CTL1 has the low voltage level of Vss and the control signal CTL2 has the high voltage level Vcc will be described under the condition of the input signals Vi1, Vi2, Vi3 and Vi4 being not yet supplied. At this time, the output buffer of the FIG. 4 performs a precharge mode. Therefore, the boost voltage transfer transistor P11 is turned on, thereby precharging the capacitor MC1 to the level of the boost voltage Vpp. Further, the substrate voltage transfer transistor N15 is turned on, thereby precharging the capacitor MC2 to the level of the substrate voltage VBB. At this time, the output from the output node is maintained at the high impedance state.

Under this state, the operation of the output buffer for generating the output of the level of the supply voltage Vcc now will be described. This operation is performed under the condition when the input signals Vi1, Vi2, respectively, have the high voltage level of Vpp, and the input signals Vi3, Vi4, respectively, have the low voltage level of Vss and VBB. Since the control signal CTL1 of the high voltage level of Vpp as shown in FIG. 5A is applied, the boost voltage transfer transistor P11 is turned off. Further, since the input signals Vi2 and Vi1 of the high voltage level of Vpp as shown in FIGS. 5B and 5C are respectively applied, the first and second pull-up transistors N11 and N12 are respectively turned on. At this time, since the input signal Vi3 has the low voltage level of VBB and the input signal Vi4 has the low voltage level of Vss, the first and second pull-down transistors N13 and N14 are respectively turned off. Therefore, the output Vo having the high voltage level of Vcc as shown in FIG. 5G is generated. Here, the characteristics of the output buffer of the present invention are generated. That is, the boost voltage Vpp precharged in the capacitor MC1 in the previous precharge mode is applied to the output node with the turn-on of the first pull-up transistor N11. Therefore, since the boost voltage Vpp through the channel of the first pull-up transistor in addition to the supply voltage Vcc through the channel of the second pull-up transistor N12 is applied to the output node, the output Vo is raised to the high voltage level of Vcc in a short period. Therefore, although the level of the supply voltage Vcc is changed by the transient bouncing of the supply voltage Vpp, the output Vo at the high voltage level is normally generated. On the other hand, the input signal Vi1 applied to the gate of the first pull-up transistor N11 is maintained at the high voltage level of Vpp only while the boost voltage precharged in the capacitor MC1 shown in FIG. 5C is discharged.

The operation of the output buffer for generating the output of the low voltage level of Vss now will be described. This operation is performed under the condition when the respective input signals Vi1, Vi2 have the low voltage level of Vss and the respective input signals Vi3, Vi4 have the high voltage level of Vcc. Since the control signal CTL2 of the low voltage level of VBB as shown in FIG. 5D is applied, the substrate voltage transfer transistor P15 is turned off. Further, since the input signals Vi3 and Vi4 of the high voltage level of Vcc as shown in FIGS. 5E and 5F are respectively applied, the first and second pull-down transistors N13 and N14 are respectively turned on. At this time, since the input signals Vi1 and Vi2 at the low voltage level of Vss are applied, the first and second pull-up transistors N11 and N12 are respectively turned off.

Therefore, the output Vo having the low voltage level of Vss as shown in FIG. 5G is generated. Here, the characteristics of the output buffer of the present invention are generated. That is, the substrate voltage VBB precharged in the capacitor MC2 in the previous precharge mode is applied to the output node with the turn-on of the second pull-down transistor N14. Therefore, since the substrate voltage VBB through the channel of the second pull-down transistor in addition to the ground voltage Vss through the channel of the first pull-down transistor N13 is applied to the output node, the output Vo is discharged to the low voltage level of Vss in a short time. Therefore, although the level of the ground voltage Vss is changed by the transient bouncing of the ground voltage Vss, the output Vo at the low voltage level is normally generated. On the other hand, the input signal Vi4 applied to the gate of the second pull-down transistor N14 is maintained at the high voltage level of Vcc only while the substrate voltage VBB precharged in the capacitor MC2 as shown in FIG. 5F is discharged.

On the other hand, the output buffers of FIGS. 6 and 7 are respectively provided for reducing the bouncing of the supply voltage Vcc and the bouncing of the ground voltage Vss. In the output buffer of FIG. 6, when the control signal CTL2 at the high voltage level Vcc is applied, the substrate voltage transfer transistor N19 is turned on and the capacitor MC3 is precharged to the substrate voltage VBB. Under the condition of this precharge state, after the substrate voltage transfer transistor N19 is mined on, the input signals of Vi3 and Vi4 at the high voltage level of Vcc are applied. Accordingly, the first and second pull-down transistors N17, N18 are turned on, therefore the output Vo is set to the low voltage level of Vss in a short period.

In the output buffer of FIG. 7, when the control signal CTL1 at the low voltage level Vss is applied, the boost voltage transfer transistor P12 is mined on and the capacitor MC4 is precharged to the boost voltage Vpp. Under the condition of this precharge state, after the boost voltage transfer transistor P12 is turned off, the input signals of Vi2 and Vi3 at the high voltage level of Vpp are applied. Accordingly, the first and second pull-up transistors N20, N21 are turned on, therefore the output Vo is set to the high voltage level of Vcc in a short period.

It should be readily appreciated from the foregoing description that various modifications of the output buffer shown in FIGS. 4, 6 and 7 are apparent by considering the logic relationship and the signal condition shown in the timing chart of FIGS. 5A through 5G.

As described above, the output buffer of the present invention improves the operational speed by reducing the current flowing to the supply voltage terminal and a ground voltage terminal at the time point at which an output level is changed. Accordingly, for example, the voltage drop of the output node is prevented when a plurality of the output buffers are operated on the same chip. Further, the operation speed of the output buffer is increased by reducing the bouncing of the supply voltage Vcc and the ground voltage Vss.

Although the present invention has been described in connection with several, specific, preferred embodiments thereof, it should be clearly understood that many variations and/or modifications of the basic inventive concept herein taught which may appear to those skilled in the art will still fall within the spirit and scope of the present invention as defined in the appended claims.

What is claimed is:

1. An output buffer for generating an output signal at an output node in response to an input data, comprising:

a first capacitor with one electrode thereof connected to a ground voltage;

a boost voltage transfer transistor with a channel thereof connected to a boost voltage and another electrode of said first capacitor and with a gate thereof receiving a first control signal for precharging said first capacitor to said boost voltage in response to an active input of said first control signal thereto;

a first pull-up transistor with a channel thereof connected to said another electrode of said first capacitor and said output node and with a gate thereof receiving a first input signal for transferring said boost voltage precharged in said first capacitor to said output node in response to an active input of said first input signal thereto;

a second pull-up transistor with a channel thereof connected to a supply voltage and said output node and with a gate thereof receiving a second input signal;

a second capacitor with one electrode thereof connected to said supply voltage;

a substrate voltage transfer transistor with a channel thereof connected to a substrate voltage and another electrode of said second capacitor and with a gate thereof receiving a second control signal for precharging said second capacitor to said substrate voltage in response to an active input of said second control signal thereto;

a first pull-down transistor with a channel thereof connected to said ground voltage and said output node and with a gate thereof receiving a third input signal; and a second pull-down transistor with a channel thereof connected to said another electrode of said second capacitor and said output node and with a gate thereof receiving a fourth input signal for transferring said substrate voltage precharged in said second capacitor to said output node in response to an active input of said fourth input signal thereto, wherein potential levels of said boost and supply voltage are different.

2. An output buffer for generating an output signal at an output node in response to an input data, comprising:

a pull-up transistor with a channel thereof connected to a supply voltage and said output node and with a gate thereof receiving a first input signal;

a capacitor with one electrode thereof connected to said supply voltage;

a substrate voltage transfer transistor with a channel thereof connected to a substrate voltage and another electrode of said capacitor and with a gate thereof receiving a control signal for precharging said capacitor to said substrate voltage in response to an active input of said control signal thereto;

a first pull-down transistor with a channel thereof connected to a ground voltage and said output node and with a gate thereof receiving a second input signal; and a second pull-down transistor with a channel thereof connected to said another electrode of said capacitor and said output node, and with a gate thereof receiving a third input signal for transferring said substrate voltage precharged in said capacitor to said output node in response to an active input of said third input signal thereto, wherein potential levels of said substrate and ground voltages are different.

3. An output buffer for generating an output signal at an output node in response to an input data, comprising:

a capacitor with one electrode thereof connected to a ground voltage;

a boost voltage transfer transistor with a channel thereof connected to a boost voltage and another electrode of said capacitor and with a gate thereof receiving a control signal for precharging said capacitor to said boost voltage in response to an active input of said control signal thereto;

a first pull-up transistor with a channel thereof connected to said another electrode of said capacitor and said output node and with a gate thereof receiving a first input signal for transferring said boosted voltage precharged in said capacitor to said output node in response to an active input of said first input signal thereto;

a second pull-up transistor with a channel thereof connected to a supply voltage and said output node and with a gate thereof receiving a second input signal; and a pull-down transistor with a channel thereof connected to said ground voltage and said output node and with a gate thereof receiving a third input signal, wherein potential levels of said boost and supply voltages are different.

4. An output buffer for generating an output signal at an output node in response to an input of data read from a memory cell, comprising:

a first transistor connected to a first voltage and said output node, and having a gate to receive a first input signal;

a second transistor connected to a second voltage and said output node, and having a gate to receive a second input signal;

a first capacitor with a first electrode connected to said first voltage;

a third transistor connected to a third voltage and a second electrode of said first capacitor, said first capacitor being precharged to said third voltage in response a first control signal applied at a gate of said third transistor; and a fourth transistor connected to said second electrode of first capacitor and said output node, said fourth transistor transferring said third voltage precharged in said first capacitor to said output node in response to a third input signal applied at a gate of said fourth transistor, wherein potential levels of said first and second voltages are different from the third voltage.

5. The output buffer of claim 4 further comprising:

a second capacitor with a first electrode connected to said second voltage;

a fifth transistor connected to a fourth voltage and a second electrode of said second capacitor, said second capacitor being precharged to said fourth voltage in response to a second control signal applied at a gate of said fifth transistor; and a sixth transistor connected to said second electrode of said second capacitor and said output node, said sixth transistor transferring said fourth voltage precharged in said second capacitor in response to a fourth input signal applied at a gate of said sixth transistor.

6. The output buffer of claim 4, wherein said first voltage is one of a ground voltage and a supply voltage.

7. The output buffer of claim 4, wherein said second voltage is one of a ground voltage and a supply voltage.

8. The output buffer of claim 4, wherein said third voltage is one of a substrate voltage and a boost voltage.

9. The output buffer of claim 4, wherein said first capacitor is a transistor with a source and drain coupled together to comprise said first electrode, and a gate which comprises said second electrode.

10. The output buffer of claim 4, wherein said first, second and third voltages are supply, ground and substrate voltages, respectively, and said first, second and third transistors are pull-up, pull-down, and pull-down transistors, respectively, so that transients caused by bouncing of said ground voltage is prevented.

11. The output buffer of claim 4, wherein said first, second and third voltages are ground, supply and boost voltages, respectively, and said first, second and third transistors are pull-down, pull-up and pull-up transistors, respectively, so that transients caused by bouncing of said supply voltage is prevent.

12. The output buffer of claim 5, wherein said first voltage is one of a ground voltage and a supply voltage.

13. The output buffer of claim 5, wherein said second voltage is one of a ground voltage and a supply voltage.

14. The output buffer of claim 5, wherein said third voltage is one of a substrate voltage and a boost voltage.

15. The output buffer of claim 5, wherein said fourth voltage is one of a substrate voltage and a boost voltage.

* * * * *